(12) United States Patent
Heerens

(10) Patent No.: US 7,306,680 B2
(45) Date of Patent: Dec. 11, 2007

(54) METHOD OF CLEANING BY REMOVING PARTICLES FROM SURFACES, A CLEANING APPARATUS AND A LITHOGRAPHIC PROJECTION APPARATUS

(75) Inventor: Gert-Jan Heerens, Schoonhoven (NL)

(73) Assignee: ASML Netherlands B.V., Veldhoven (NL)

( * ) Notice: Subject to any disclaimer, the term of this patent is extended or adjusted under 35 U.S.C. 154(b) by 568 days.

(21) Appl. No.: 10/658,800

(22) Filed: Sep. 10, 2003

(65) Prior Publication Data

US 2004/0103917 A1 Jun. 3, 2004

(30) Foreign Application Priority Data

Sep. 12, 2002 (EP) .................................. 02256312

(51) Int. Cl.
B08B 5/04 (2006.01)
(52) U.S. Cl. .............................. 134/21; 134/1; 134/19; 134/6; 134/7; 134/25.4; 134/42; 34/282; 34/359; 34/361; 34/363; 34/364; 34/365; 34/397; 34/401; 34/402; 34/403; 34/406; 34/409
(58) Field of Classification Search ................ 134/21, 134/1, 6, 7, 19, 25.4, 42; 34/282, 359, 361, 34/363, 364, 365, 397, 401, 402, 403, 406, 34/409; 438/906
See application file for complete search history.

(56) References Cited

U.S. PATENT DOCUMENTS

| | | | | |
|---|---|---|---|---|
| 3,420,710 A | * | 1/1969 | Wollman | ........................ 134/1 |
| 6,136,167 A | * | 10/2000 | Misiano et al. | ........ 204/298.23 |
| 6,153,044 A | | 11/2000 | Klebanoff et al. | |
| 6,395,102 B1 | | 5/2002 | Salamati-Saradh et al. | |
| 6,764,385 B2 | * | 7/2004 | Boumerzoug et al. | ......... 451/39 |
| 2001/0055104 A1 | | 12/2001 | Irie | |
| 2002/0023902 A1 | | 2/2002 | Allen | |
| 2002/0090575 A1 | | 7/2002 | Chiu | |
| 2002/0096195 A1 | | 7/2002 | Harvey et al. | |
| 2002/0096647 A1 | | 7/2002 | Moors et al. | |
| 2002/0118348 A1 | | 8/2002 | Ushiki et al. | |
| 2005/0217706 A1 | * | 10/2005 | Banerjee et al. | ............... 134/26 |
| 2005/0263170 A1 | * | 12/2005 | Tannous et al. | .............. 134/1.1 |

FOREIGN PATENT DOCUMENTS

| | | |
|---|---|---|
| JP | 55-15620 A | 2/1980 |
| JP | 61-159730 A | 7/1986 |
| JP | 63-41855 A | 2/1988 |
| JP | 6-283488 | 10/1994 |
| JP | 7-96259 | 4/1995 |
| JP | 07096259 | * 4/1995 |

(Continued)

OTHER PUBLICATIONS

English Translation of Japanese Office Action issued in Japanese Patent Application No. 2003-321110 dated Jan. 20, 2006.

(Continued)

*Primary Examiner*—M. Kornakov
(74) *Attorney, Agent, or Firm*—Pillsbury Winthrop Shaw Pittman LLP

(57) ABSTRACT

A lithographic mask is placed in a chamber which is then sealed. The gas pressure in the chamber is reduced to dislodge contaminant particles on the mask surface.

18 Claims, 3 Drawing Sheets

FOREIGN PATENT DOCUMENTS

| | | |
|---|---|---|
| JP | 7-142438 | 6/1995 |
| JP | 7-169663 A | 7/1995 |
| JP | 8-321480 A | 12/1996 |
| SU | 383531 | 5/1973 |

OTHER PUBLICATIONS

English Translation of Japanese Office Action issued in Japanese Patent Application No. 2003-321110 mailed May. 9, 2006.

* cited by examiner

METHOD OF CLEANING BY REMOVING PARTICLES FROM SURFACES, A CLEANING APPARATUS AND A LITHOGRAPHIC PROJECTION APPARATUS

BACKGROUND OF THE INVENTION

1. Field of the Invention

The present invention relates to a method of cleaning by removing particles from surfaces, a cleaning apparatus and a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

To ensure a sharp and clean image is projected onto the substrate the mask is thoroughly cleaned before use. Any particles remaining on the surface of the mask could ruin the image and scratch the mask. As the critical dimensions of integrated circuits decrease, the scope for imaging error increases, and so the importance of eliminating stray particles is ever increasing. To avoid scratching particularly delicate masks, a non-contact method of cleaning is desirable. Present methods of non-contact cleaning include laser cleaning, burst cleaning or wet ultrasound cleaning. However, with these methods there is a risk of damage to the mask due to the nature of vibrations induced in the particles.

SUMMARY OF THE INVENTION

It is an aspect of the present invention to provide a new and improved method of cleaning a mask or other object by removing particles from the surface of the mask or other object.

This and other aspects are achieved according to the present invention in a method of cleaning a surface of an object by removing particles from the surface of the object including placing the object in a chamber with the surface to be cleaned exposed; sealing the chamber; and reducing the gas pressure in the chamber to a low pressure, wherein the gas pressure is reduced quickly.

The inventors have found that reducing the gas pressure from atmospheric pressure to $10^{-2}$ mbar achieves beneficial results. Further, the gas pressure drop should preferably take place over less than 5 seconds. To create a greater gas pressure differential the gas pressure can be increased prior to the quick pressure drop.

After quickly reducing the gas pressure, it can then be quickly (i.e. the pressure change takes place in less than 5 seconds) increased, preferably to the original gas pressure before the gas pressure was reduced. For particularly thorough cleaning, the gas pressure is repeatedly cycled between a low pressure and a higher pressure.

The inventive cleaning method can be used in conjunction with other methods of removing particles. For example, an electric field can be used to attract and remove particles away from the surface. This would provide an additional force removing the particles. To increase this force further the surface of the object to be cleaned is charged. Alternatively, or additionally, the object is vibrated, which helps to loosen any particles that may be caught on the surface of the object by static friction. Similarly, bombarding the surface of the object to be cleaned with inert particles helps remove immobile contaminant particles caught by static friction. Due to its inert nature and low price, condensed $CO_2$ has been found to be ideal for this purpose. Changing the temperature of the object can also help dislodge a particle, due to the consequential expansion or contraction of the material. These additional methods of removing particles can either take place during or prior to the chamber depressurization.

To decrease adhesion forces between the particle and the surface of the object to be cleaned, a layer of liquid, preferably a solvent, can be applied to the surface of the object to be cleaned.

The present invention has been developed particularly for the cleaning of lithographic masks, although it is applicable to all other sensitive surfaces.

According to a further aspect of the present invention there is provided an apparatus for removing particles from surfaces of objects including a chamber with a door capable of being sealed; a pump configured to reduce the gas pressure of the sealed chamber; and at least one of the following: a voltage source configured to provide an electric field to attract and remove the particles from the surface; an actuator configured to vibrate the object to be cleaned; an inert particle supply configured to bombard the surface of the object to be cleaned with particles; and a liquid supply configured to apply a layer of liquid of the surface of the object to be cleaned.

According to a further aspect of the invention there is provided a lithographic apparatus including a radiation system configured to supply a projection beam of radiation; a support configured to support a patterning device, the patterning device serving to pattern the projection beam according to a desired pattern; a substrate table configured to hold a substrate; and a projection system configured to project the patterned beam onto a target portion of the substrate; a device for removing particles from surfaces of objects comprising: a chamber with a door capable of being sealed in an air tight manner; and a pump configured to reduce the gas pressure of the sealed chamber from atmospheric pressure to $10^{-2}$ mbar in less than 5 seconds.

The present invention is therefore particularly applicable to lithography involving EUV radiation as this is an area of lithography which is particularly sensitive to errors.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
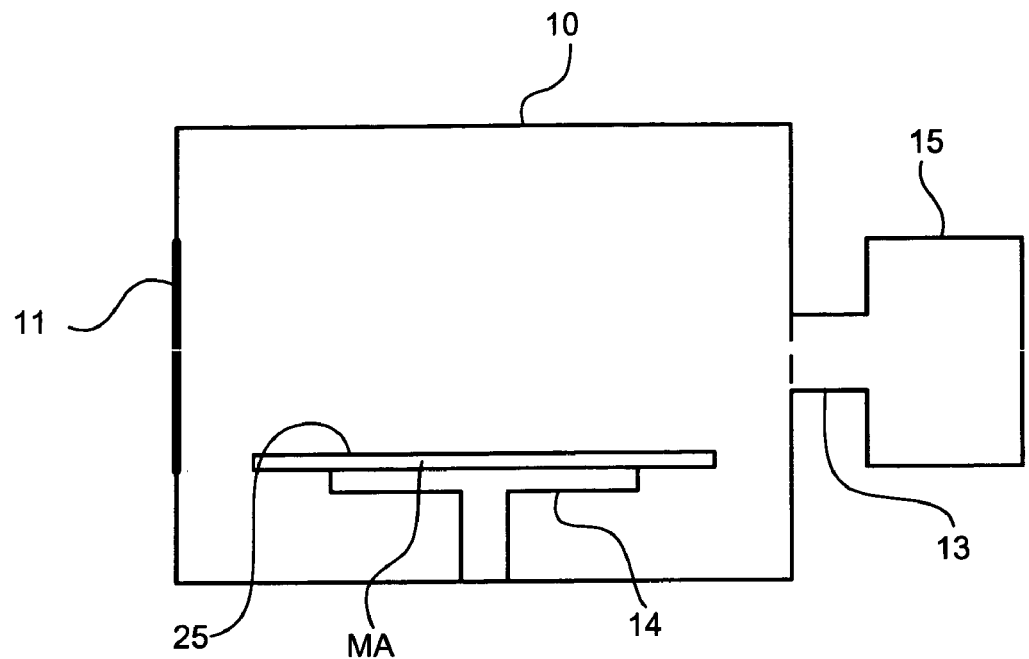
FIG. 1 depicts a cleaning apparatus according to a first embodiment of the invention.
Figure 2:
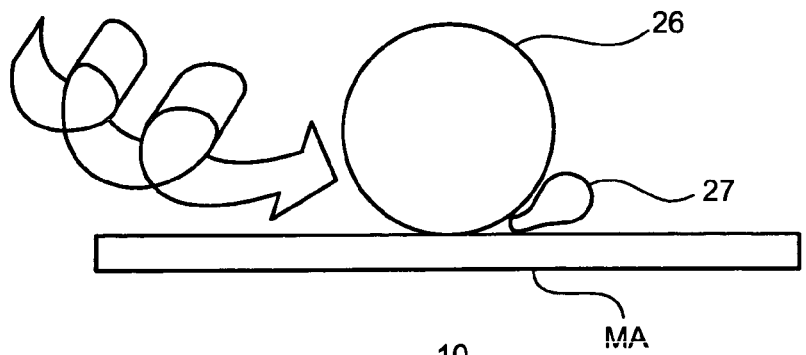
FIG. 2 shows a method of dislodging a particle.

FIG. 1 shows an apparatus according to the present invention with a chamber 10 having a door 11 which can be sealed in an air tight fashion, such that there can be a large pressure differential between inside and outside the chamber 10. A pipe 13 leads from the inside of the chamber 10 to a pump 15 and inside the chamber there is an object table 14. A mask MA to be cleaned is fixed on the object table 14 with the surface 25 to be cleaned exposed. The mask MA should be firmly fixed to the object table 14 by, for example vacuum suction. Once the door 11 has been sealed the pump 15 reduces the gas pressure inside the chamber 10 from atmospheric pressure to $10^{-2}$ mbar in about 1 second. The time to reduce the gas pressure can vary, but should not be more than 5 seconds. The inventors have conducted experiments to show that this rapid depressurization can successfully dislodge particles. It is not known exactly how the depressurization dislodges the particles but a probable method is that as the gas is extracted from the chamber 10 very quickly, pockets of gas 27 caught behind the contaminant particles 26 dislodge the particles 26 as shown in FIG. 2. Another possible force dislodging the particles 26 is the turbulent flow of the gas which can knock the particles 26, therefore dislodging them. Once the particles 26 have been dislodged they are extracted from the chamber 10 with the air and then removed from the air stream. After decreasing the gas pressure, the gas pressure is then increased back up to atmospheric pressure in 1 second. Rapidly increasing the gas pressure inside the chamber also generates turbulence and pockets of air can similarly dislodge the particles. The cycle of decreasing the pressure from atmospheric pressure to a lower pressure and back up to atmospheric pressure can be repeated as many times as necessary.

The pressure does not have to be decreased to $10^{-2}$ mbar, but the greater and faster the pressure drop the more effective the cleaning method. Thus, decreasing the pressure to $10^{-7}$ mbar would be more advantageous still. Similarly, the gas pressure does not have to be rapidly decreased from 1 atmosphere. For example the gas pressure in the chamber could be increased to 10, or even 100 atmospheres (or any pressure in between) to generate a greater rapid pressure drop to $10^{-2}$ or $10^{-7}$ mbar (or any pressure in between).

To reduce the adhesive forces between the particles 26 and the surface of the mask 25 to be cleaned, the components of gas in the chamber 10 can be varied. Optimizing the gas mixture can also be used to improve, and increase the chances of, particle removal due to, e.g. different viscosities.

Figure 3:
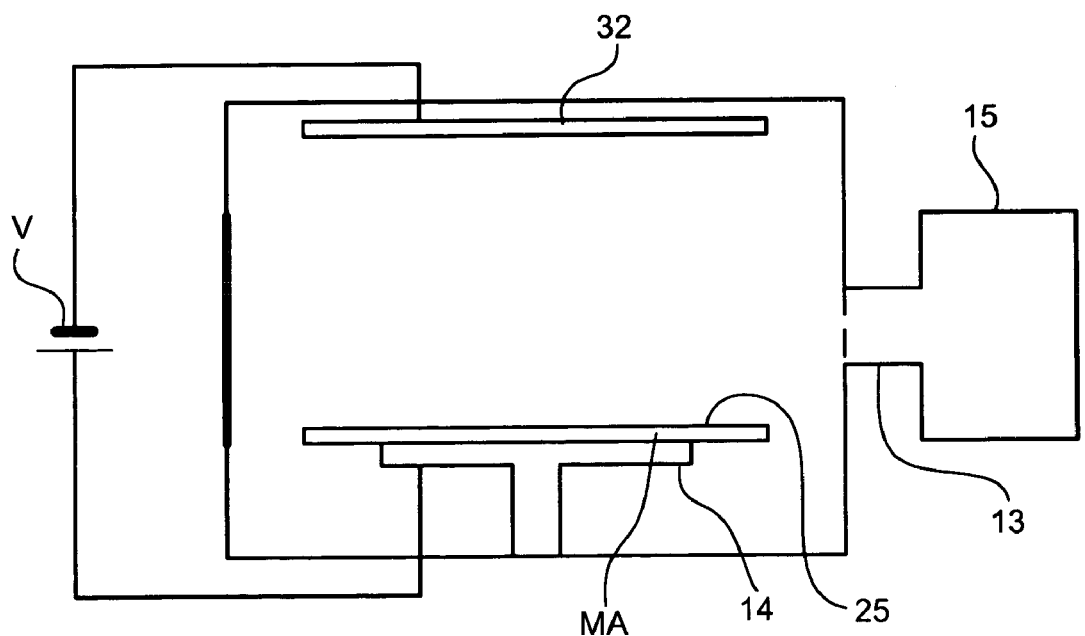
FIG. 3 depicts a cleaning apparatus with electrostatic attracting means according to a second embodiment of the present invention.

As shown in FIG. 3, there is a chargeable plate 32 in the chamber opposite the surface 25 of the mask MA to be cleaned. In this embodiment, the object table 14 is made of metal and can also be charged. At the same time as the rapid decrease in pressure of the chamber 10, a voltage source V charges the charged plate 32 and the object table 14 to between 10 and 2000 V. The mask MA on the object table 14 will therefore also become charged. As the mask MA is charged, the particles on it will be attracted towards the charged plate 32. There is therefore another force for dislodging the particles 26.

Figure 4:
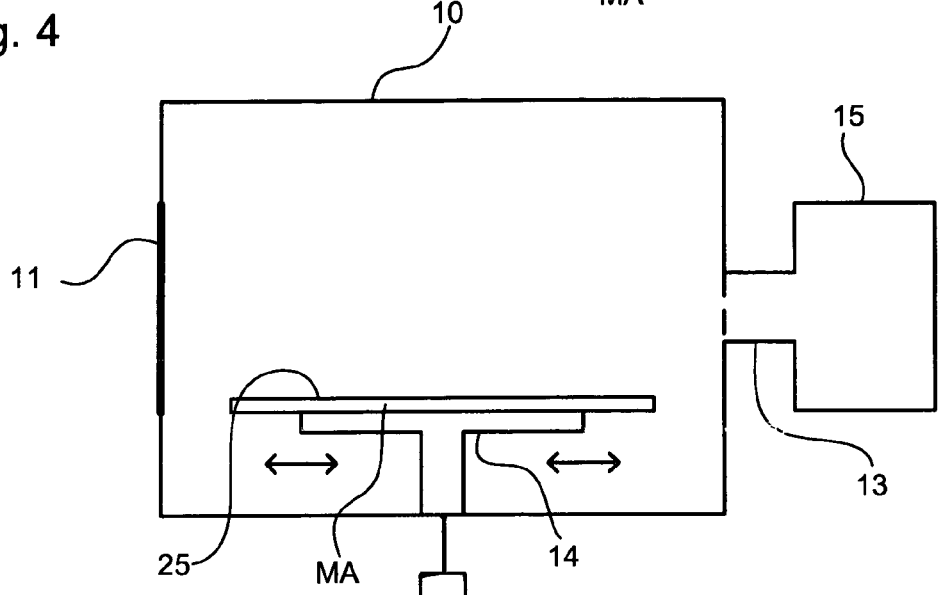
FIG. 4 depicts a cleaning apparatus with a vibrating object table according to a third embodiment of the present invention.

Referring to FIG. 4, in this embodiment the object table 14 is vibrated by an actuator 30 before, during, and/or after depressurization of the chamber 10. The vibrations shown in FIG. 4 (by double-headed arrows) are linearly parallel to the plane of the mask MA and are of the order of 1 mm. The frequency of vibration can be between 50 to 500 Hz. One of the forces adhering the particles 26 to the mask MA is static friction. When the object table 14 (and also the mask MA since it is firmly fixed to the object table 14) changes direction during the vibration, the inertia of the particles causes them to continue to travel in the original direction while the mask MA changes direction beneath them. This overcomes the static friction and dislodges the particles 26.

Instead of linear vibrations, rotational vibrations parallel to the plane of the mask MA could also be used. These should be approximately 5° at a frequency of between 1 and 5000 Hz. Alternatively, linear vibrations perpendicular to the plane of the mask MA could be used.

Figure 5:
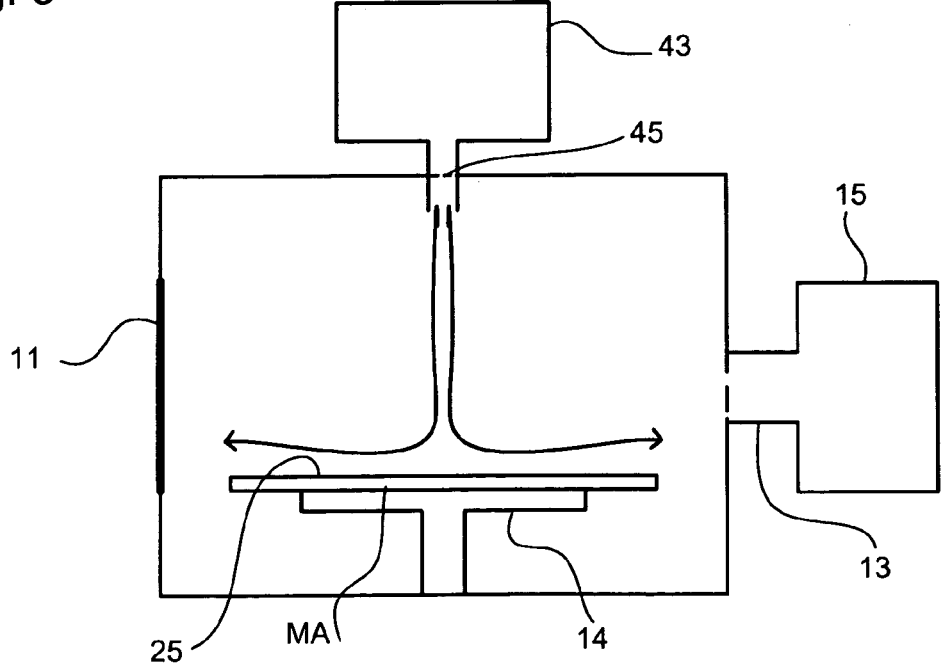
FIG. 5 depicts a cleaning apparatus in which the mask is bombarded by condensed $CO_2$ according to a fourth embodiment of the present invention.

As shown in FIG. 5, condensed $CO_2$ is contained in a container 43 outside the chamber 10. The condensed $CO_2$ is projected through a one way valve 45 towards the mask MA at the same time as the chamber 10 is depressurized. When the particles of condensed $CO_2$ bombard the mask MA the force dislodges the particles 26 from the surface of the mask 25 to be cleaned. The condensed $CO_2$ evaporates and is extracted from the chamber 10 during the depressurization. This method is not restricted to the use of condensed $CO_2$, and any inert liquid or solid in particle form could be used.

Figure 6:
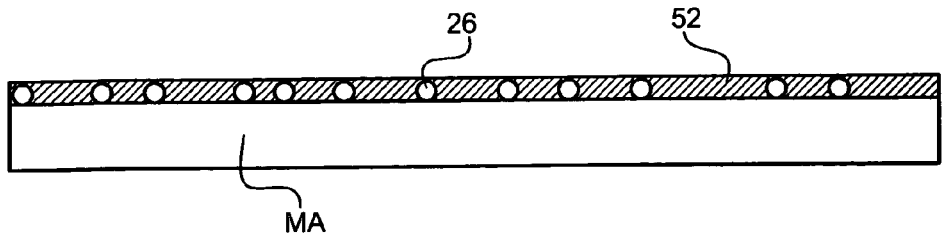
FIG. 6 shows a cross-section of a mask with a layer of solvent.

Referring to FIG. 6, a thin layer of solvent 52 is applied to the surface 25 of the mask MA to be cleaned prior to the depressurization of the chamber 10. The solvent reduces the adhesion forces between the particles 26 and the mask MA, and dissolves the particles 26. The layer of solvent 52 should therefore be uniform across the entire surface of the substrate to be cleaned to ensure that the solvent is adjacent to all the particles 26, and preferably sufficiently thick to completely cover the particles 26, in order to dissolve or suspend the particles 26. As the gas pressure in the chamber is reduced and gas is extracted, the solvent, together with the dissolved or suspended particles will be extracted from the chamber 10. The particles can then be removed from the gas. The solvent can be varied to optimize the particles 26 solubility therein. The solvent may be applied, for example, by a container and one-way valve, similar to the container and one-way valve shown in FIG. 5.

Figure 7:
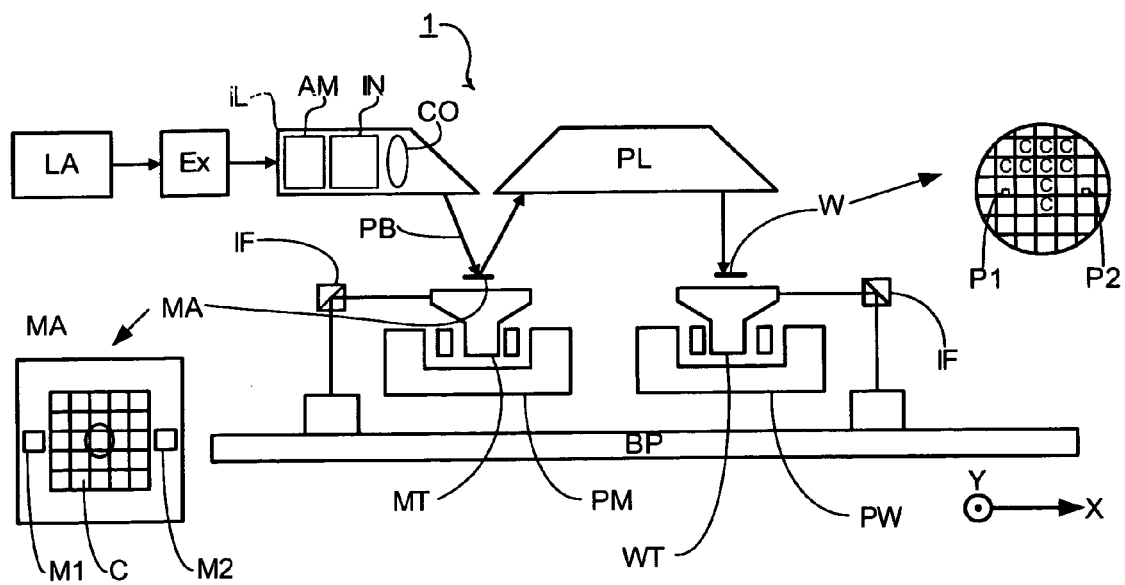
FIG. 7 depicts a lithographic projection apparatus according to an embodiment of the invention.

The apparatus described above can be used as an individual cleaning device, or it can be part of a larger lithographic apparatus. FIG. 7 schematically depicts a lithographic projection apparatus in which a device described in any one of the previous embodiments could be incorporated.

FIG. 7 schematically depicts a lithographic projection apparatus 1 according to an embodiment of the invention. The apparatus 1 includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM configured to set the outer and/or inner radial extent (commonly referred to as σ-outer and σ-inner, respectively) of the intensity distribution in the projection beam PB. In addition, it will generally comprise various other components, such as an integrator IN and a condenser CO. In this way, the projection beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

While specific embodiments of the invention have been described above, it will be appreciated that the invention may be practiced otherwise than as described. The description is not intended to limit the invention.

What is claimed is:

1. A method of cleaning a surface of an object by removing contaminant particles from the surface of the object, the method comprising:
   placing the object in the chamber with the surface to be cleaned exposed;
   sealing the chamber; and
   reducing a gas pressure in the chamber, wherein the gas pressure is reduced from a first pressure of about atmospheric pressure or higher to a second pressure, wherein the second pressure is about $10^{-2}$ mbar, in less than 5 seconds.

2. A method according to claim 1, wherein the object is a lithographic mask.

3. A method according to claim 1, further comprising cycling the gas pressure between a low pressure and a higher pressure.

4. A method according to claim 1, further comprising increasing the gas pressure prior to reducing the gas pressure.

5. A method according to claim 1, further comprising providing an electric field to attract and remove the contaminant particles from the surface.

6. A method according to claim 5, further comprising charging the surface of the object.

7. A method according to claim 1, further comprising vibrating the object.

8. A method according to claim 1, further comprising changing the temperature of the object.

9. A method according to claim 1, further comprising applying a layer of liquid to the surface of the object.

10. A method according to claim 9, wherein the layer is uniform across an entire surface of the object.

11. A method according to claim 1, wherein the first pressure is atmospheric pressure.

12. A method according to claim 1, further comprising increasing the gas pressure to at or above about 10 atmospheres of pressure prior to reducing the gas pressure.

13. A method of cleaning a surface of an object by removing contaminant particles from the surface of the object, the method comprising:

placing the object in the chamber with the surface to be cleaned exposed;

sealing the chamber;

reducing a gas pressure in the chamber from a first pressure of at or above about atmospheric pressure to a second pressure of about $10^{-2}$ mbar in less than 5 seconds; and increasing the gas pressure subsequent to decreasing the pressure in the chamber, wherein the gas pressure is increased to about the first pressure in less than 5 seconds.

14. A method according to claim 13, further comprising increasing the first gas pressure to at or above about 10 atmospheres of pressure prior to reducing the gas pressure from the first pressure to the second pressure.

15. A method according to claim 13, further comprising increasing the gas pressure to at or above about 100 atmospheres of pressure prior to reducing the gas pressure from the first pressure to the second pressure.

16. A method according to claim 13, further comprising at least one of the following: providing an electric field to attract and remove the contaminant particles from the surface; vibrating the object; bombarding the surface of the object with inert particles; or applying a layer of liquid to the surface of the object.

17. A method of cleaning a surface of an object by removing contaminant particles from the surface of the object, the method comprising:

placing the object in the chamber with the surface to be cleaned exposed;

sealing the chamber;

reducing a gas pressure in the chamber from a first pressure of about atmospheric pressure or higher to a second pressure of about $10^{-2}$ mbar in less than 5 seconds; and bombarding the surface of the object with inert particles.

18. A method according to claim 17, wherein the inert particles are condensed $CO_2$.

* * * * *